United States Patent
Mohapatra et al.

(10) Patent No.: US 9,911,550 B2
(45) Date of Patent: Mar. 6, 2018

(54) TOUCH SENSITIVE DEVICE WITH MULTIPLE ABLATION FLUENCE VALUES

(71) Applicant: Apple Inc., Cupertino, CA (US)

(72) Inventors: Siddharth Mohapatra, Santa Clara, CA (US); Sunggu Kang, San Jose, CA (US); John Z. Zhong, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/784,749

(22) Filed: Mar. 4, 2013

(65) Prior Publication Data

US 2013/0228442 A1 Sep. 5, 2013

Related U.S. Application Data

(60) Provisional application No. 61/606,894, filed on Mar. 5, 2012.

(51) Int. Cl.
*H01L 29/84* (2006.01)
*H01H 11/00* (2006.01)
(Continued)

(52) U.S. Cl.
CPC ............ *H01H 11/00* (2013.01); *G06F 3/044* (2013.01); *H03K 17/9622* (2013.01); *G06F 2203/04103* (2013.01); *Y10T 29/49105* (2015.01)

(58) Field of Classification Search
CPC .......... G06F 2203/04103; G06F 3/044; H01L 29/7869; H01L 27/124; H01L 21/02565; H01L 21/02554
(Continued)

(56) References Cited

U.S. PATENT DOCUMENTS 4,838,656 A 6/1989 Stoddard
5,483,261 A 1/1996 Yasutake
(Continued)

FOREIGN PATENT DOCUMENTS

JP 2000-163031 A 6/2000
JP 2002-342033 A 11/2002

OTHER PUBLICATIONS

Zeng et al, "Characterization of modified surface of indium tin oxide film during process of laser patterning", Second International Symposium on Laser Precision Microfabrication,Isamu Miyamoto, Yong Feng Lu, Koji Sugioka, Jan J. Dubowski, Editors, Proceedings of SPIE vol. 4426 (2002).*

(Continued)

*Primary Examiner* — Duy T Nguyen
(74) *Attorney, Agent, or Firm* — Morrison & Foerster LLP

(57) ABSTRACT

Processes for fabricating compact touch sensors for touch sensitive devices are disclosed. A process can include providing a touch sensor structure having a substrate, a first layer disposed on the substrate, and a second layer disposed on the first layer. The second layer can have an ablation fluence value that is lower than an ablation fluence value of the first layer. The process can include patterning the second layer with a laser emitting energy having a fluence value greater than or equal to the ablation fluence value of the second layer and less than the ablation fluence value of the first layer. The process can further include etching at least a portion of the first layer that was exposed during the patterning of the second layer. At least a portion of the second layer can then be removed by etching or laser ablation.

22 Claims, 14 Drawing Sheets

(51) Int. Cl.
*H03K 17/96* (2006.01)
*G06F 3/044* (2006.01)

(58) Field of Classification Search
USPC .......................................... 438/800; 257/415
See application file for complete search history.

(56) References Cited

U.S. PATENT DOCUMENTS

| | | | |
|---|---|---|---|
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,379,569 B1 | 4/2002 | Rouberol | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2* | 2/2010 | Hotelling | G06F 3/0416 178/18.01 |
| 8,479,122 B2 | 7/2013 | Hotelling et al. | |
| 2004/0238835 A1* | 12/2004 | Grupp et al. | 257/98 |
| 2005/0076824 A1* | 4/2005 | Cross | G06F 3/045 116/205 |
| 2006/0026521 A1 | 2/2006 | Hotelling et al. | |
| 2006/0197753 A1 | 9/2006 | Hotelling | |
| 2008/0264699 A1* | 10/2008 | Chang et al. | 178/18.01 |
| 2009/0201268 A1* | 8/2009 | Endo et al. | 345/174 |
| 2009/0266621 A1 | 10/2009 | Huang et al. | |
| 2010/0200539 A1* | 8/2010 | Yun et al. | 216/13 |
| 2011/0148823 A1* | 6/2011 | Chen | 345/176 |
| 2011/0186937 A1* | 8/2011 | Scheiper | H01L 21/28088 257/402 |
| 2011/0297965 A1* | 12/2011 | Akimoto et al. | 257/79 |
| 2012/0032904 A1* | 2/2012 | Moon | G06F 3/041 345/173 |
| 2013/0127770 A1* | 5/2013 | Trend | G06F 3/044 345/174 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner touch sensor structure
400 personal device 1400 personal device 1500

TOUCH SENSITIVE DEVICE WITH MULTIPLE ABLATION FLUENCE VALUES

FIELD

This relates generally to touch sensitive devices and, more specifically, to processes for fabricating touch sensors for touch sensitive devices.

BACKGROUND

Touch sensitive devices have become popular as input devices to computing systems due to their ease and versatility of operation as well as their declining price. A touch sensitive device can include a touch sensor panel, which can be a clear panel with a touch sensitive surface, and a display device, such as a liquid crystal display (LCD), that can be positioned partially or fully behind the panel or integrated with the panel so that the touch sensitive surface can cover at least a portion of the viewable area of the display device. The touch sensitive device can allow a user to perform various functions by touching the touch sensor panel using a finger, stylus or other object at a location often dictated by a user interface (UI) being displayed by the display device. In general, the touch sensitive device can recognize a touch event and the position of the touch event on the touch sensor panel, and the computing system can then interpret the touch event in accordance with the display appearing at the time of the touch event, and thereafter can perform one or more actions based on the touch event.

One type of touch sensor panel that can be used is a capacitive touch sensor panel. Typical capacitive touch sensor panels can include a grid formed by rows of drive lines intersecting columns of sense lines. The drive lines can be driven by stimulation signals that cause the capacitively coupled sense lines to generate output touch signals representative of touch events detected on the surface of the panel. These drive lines and sense columns can be routed along the edge of a touch sensitive device to drive and sense circuitry, respectively. The thickness of the border around the edges of the touch sensitive device can depend on the number of drive lines, the number of sense lines, and the distances between each line. As touch sensitive devices continue to get smaller, it is desirable to reduce these distances between the drive and sense lines.

Conventionally, the drive lines and sense lines can be fabricated on the touch sensor panel using various processes, such as lithography, printing, or laser ablation. However, lithography and printing typically result in large distances between lines, and are thus in some circumstances undesirable for generating devices with thin borders. Laser ablation, on the other hand, allows for much finer patterning of the line material. However, the laser ablation process can damage the underlying substrate when patterning a line material having a high ablation fluence value, such as indium tin oxide (ITO).

SUMMARY

Processes for fabricating compact touch sensors for touch sensitive devices are disclosed. A process can include providing a touch sensor structure having a substrate, a first layer disposed on the substrate, and a second layer disposed on the first layer. The second layer can have an ablation fluence value that is lower than an ablation fluence value of the first layer. The process can include patterning the second layer with a laser emitting a beam having a fluence value greater than or equal to the ablation fluence value of the second layer and less than the ablation fluence value of the first layer. The process can further include etching at least a portion of the first layer that was exposed during the patterning of the second layer. At least a portion of the second layer can then be removed by etching or laser ablation. The processes can be used in sheet-to-sheet processes for rigid or flexible substrates or roll-to-roll processes for flexible substrates.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to processes for fabricating compact touch sensors for touch sensitive devices. A process can include providing a touch sensor structure having a substrate, a first layer disposed on the substrate, and a second layer disposed on the first layer. The second layer can have an ablation fluence value that is lower than an ablation fluence value of the first layer. An ablation fluence value of a material can refer to a fluence value (energy per unit area) of a beam emitted by a laser at which ablation of the material can occur. The process can include patterning the second layer with a laser emitting a beam having a fluence value that is greater than or equal to the ablation fluence value of the second layer and less than the ablation fluence value of the first layer. The process can further include etching at least a portion of the first layer that was exposed during the patterning of the second layer. At least a portion of the second layer can then be removed by etching or laser ablation. The processes can be used in sheet-to-sheet processes for rigid or flexible substrates or roll-to-roll processes for flexible substrates.

Figure 1:
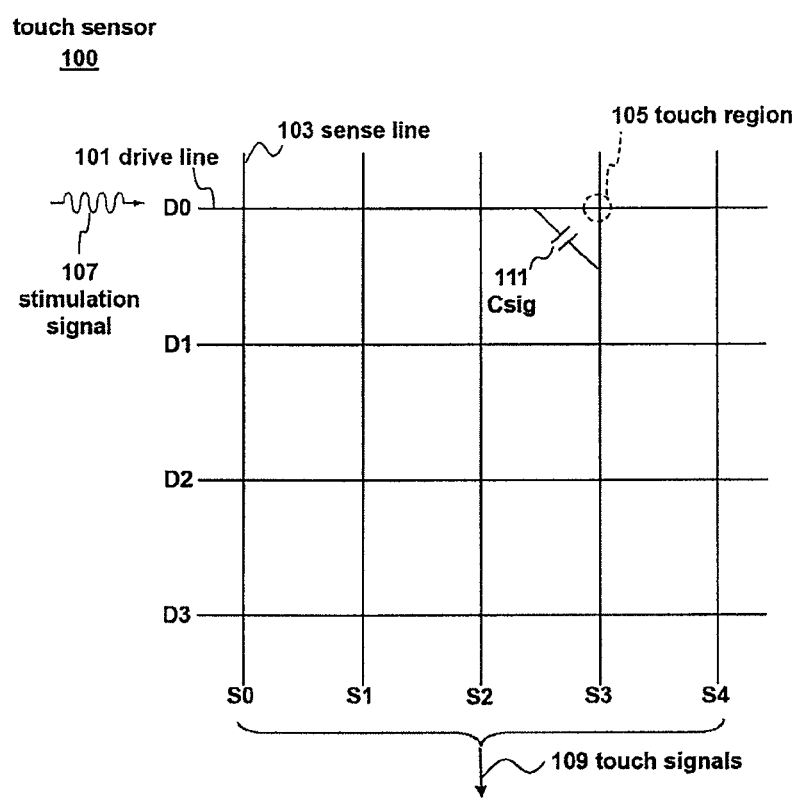
FIG. 1 illustrates an exemplary touch sensor that can be used with a touch sensitive device according to various embodiments.

FIG. 1 illustrates touch sensor 100 that can be used to detect touch events on a touch sensitive device, such as a mobile phone, tablet, touchpad, portable computer, portable media player, or the like. Touch sensor 100 can include an array of touch regions 105 that can be formed at the crossing points between rows of drive lines 101 (D0-D3) and columns of sense lines 103 (S0-S4). Each touch region 105 can have an associated mutual capacitance Csig 111 formed between the crossing drive lines 101 and sense lines 103 when the drive lines are stimulated. The drive lines 101 can be stimulated by stimulation signals 107 provided by drive circuitry (not shown) and can include an alternating current (AC) waveform. The sense lines 103 can transmit touch signals 109 indicative of a touch at the touch sensor 100 to sense circuitry (not shown), which can include a sense amplifier for each sense line, or a fewer number of sense amplifiers that can be multiplexed to connect to a larger number of sense lines.

To sense a touch at the touch sensor 100, drive lines 101 can be stimulated by the stimulation signals 107 to capacitively couple with the crossing sense lines 103, thereby forming a capacitive path for coupling charge from the drive lines 101 to the sense lines 103. The crossing sense lines 103 can output touch signals 109, representing the coupled charge or current. When a user's finger (or other object) touches the touch sensor 100, the finger can cause the capacitance Csig 111 to reduce by an amount ΔCsig at the touch location. This capacitance change ΔCsig can be caused by charge or current from the stimulated drive line 101 being shunted through the touching finger to ground rather than being coupled to the crossing sense line 103 at the touch location. The touch signals 109 representative of the capacitance change ΔCsig can be transmitted by the sense lines 103 to the sense circuitry for processing. The touch signals 109 can indicate the touch region where the touch occurred and the amount of touch that occurred at that touch region location.

While the embodiment shown in FIG. 1 includes four drive lines 101 and five sense lines 103, it should be appreciated that touch sensor 100 can include any number of drive lines 101 and any number of sense lines 103 to form the desired number and pattern of touch regions 105. Additionally, while the drive lines 101 and sense lines 103 are shown in FIG. 1 in a crossing configuration, it should be appreciated that other configurations are also possible to form the desired touch region pattern. While FIG. 1 illustrates mutual capacitance touch sensing, other touch sensing technologies may also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor 100 can also sense a hovering object and generate hover signals therefrom.

Figure 2:
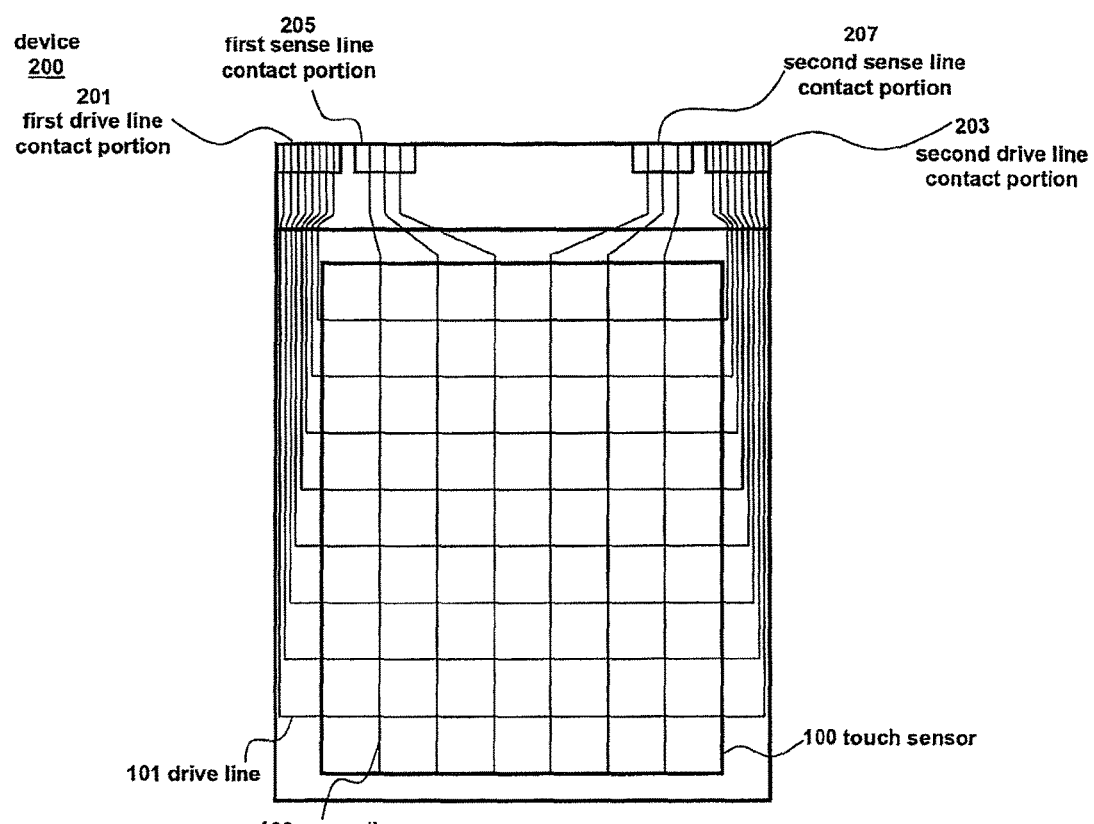
FIG. 2 illustrates an exemplary touch sensitive device according to various embodiments.

FIG. 2 illustrates a top-view of an exemplary device 200, such as a mobile phone, touchpad, portable computer, portable media player, or the like. Device 200 can include a touch sensor 100 for detecting touch events on the display of the device. In the example shown in FIG. 2, touch sensor 100 can include eight drive lines 101 and six sense lines 103. However, it should be appreciated that a touch sensor 100 having any number of drive lines 101 and sense lines 103 can be used.

In some examples, one end of the drive lines 101 can be routed along an edge of device 200 to a first drive line output pad or contact portion 201, while the other end of the drive lines 101 can be routed along an opposite edge of device 200 to a second drive line output pad or contact portion 203. The first drive line contact portion 201 and second drive line contact portion 203 can include exposed segments of each of the drive lines 101 and can be used by an external device or connector, such as a flat cable or flexible printed circuit ("FPC"), to couple to each end of the drive lines 101.

In some examples, one end of a portion of the sense lines 103 can be routed to a first sense line output pad or contact portion 205, while the remaining sense lines 103 can be routed to a second sense line output pad or contact portion 207. Similar to the drive line contact portions 201 and 203, sense line contact portions 205 and 207 can include exposed segments of the sense lines 103 and can be used by an external device or connector, such as a flat cable or FPC, to couple to an end of the sense lines 103. While the example shown in FIG. 2 includes three sense lines 103 routed to first sense line contact portion 205 and three sense lines 103 routed to the second sense line contact portion 207, it should be appreciated that any number of sense lines 103 can be routed to any number of sense line contact portions. For example, device 200 can include ten sense lines with all ten sense lines 103 being routed to a single sense line contact portion, while in other examples, device 200 can include nine sense lines with three sense lines being routed to each of three sense line contact portions. Moreover, while FIG. 2 shows contact portions 201, 203, 205, and 207 along the top edge of the device, it should be appreciated that contact portions 201, 203, 205, and 207 can be located in different areas of device 200 depending on the location of the components of device 200, with the drive lines 101 and sense lines 103 being appropriately routed around these components to their corresponding contact portions.

In some examples, a cover material (e.g., glass, plastic, or the like), can be placed over the components shown in FIG. 2. This cover material can include a black mask along its edges to hide the portions of drive lines 101 and sense lines 103 outside the viewable area of the device from the user's view. For example, the black mask can cover the portions of drive lines 101 and sense lines located along the edges of device 200. As can be seen in FIG. 2, the width of the black mask required on the right and left sides of device 200 depends on the number of drive lines 101 and the distances between the drive lines 101 along the edges of device 200. To reduce the width of the black mask and to reduce the overall width of the device, it can be desirable to reduce the distances between the drive lines 101. It should be appreciated that when drive lines 101 and sense lines 103 are routed in different configurations, the width of the black mask required to cover the drive lines 101 and sense lines 103 outside the viewable area of the device can additionally or alternatively depend on the number of sense lines 103 and distances between sense lines 103 and/or distances between sense lines 103 and drive lines 101.

Figure 3:
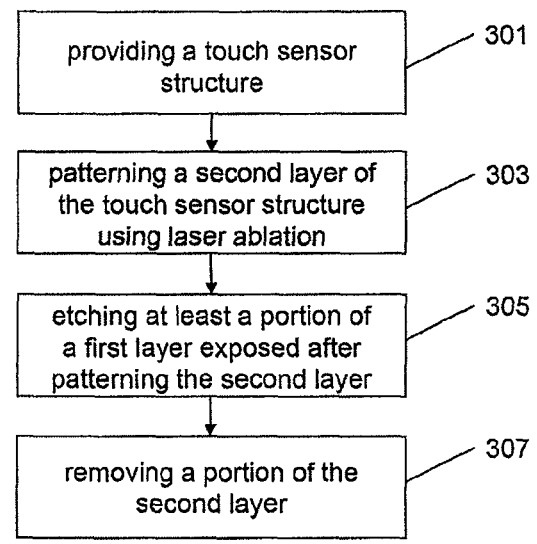
FIG. 3 illustrates an exemplary process for manufacturing a touch sensor according to various embodiments.
Figure 4:
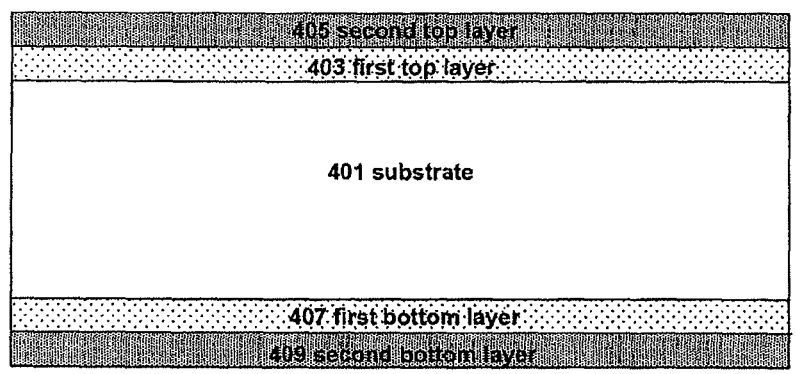
FIG. 4 illustrates a cross-sectional view of an exemplary touch sensor structure according to various embodiments.

FIG. 3 illustrates an exemplary process 300 for manufacturing a touch sensor similar or identical to touch sensor 100. Process 300 will be described below with reference to FIGS. 4-11. At block 301, a touch sensor structure can be provided. FIG. 4 illustrates an exemplary touch sensor structure 400 that can be used in process 300. Touch sensor structure 400 can include substrate 401 made of any substrate material, such as plastic, glass, a rigid or flexible glass, or rigid or flexible composite. Touch sensor structure 400 can further include first top layer 403 disposed on the top surface of substrate 401. First top layer 403 can include an electrically conductive material, such as ITO, copper, silver, other metals, other oxides, or the like. Touch sensor structure 400 can further include second top layer 405 disposed on a surface of first top layer 403 opposite substrate 401. Second top layer 405 can include silver, gold, aluminum, other metals, a passivation layer, or the like. Second top layer 405 can be formed from a single layer or can include a combination of layers, such as a multilayer metal or metal-organic stack. In some examples, the material of second top layer 405 can have an ablation fluence value that is lower than an ablation fluence value of the material of the first top layer 403. In other words, the fluence value of the laser beam required to ablate the material of second top layer 405 can be lower than the fluence value of the laser beam required to ablate the material of first top layer 403. As will be described in greater detail below, the selection of materials having these relative ablation fluence values can allow second top layer 405 to be used as an etching mask for first top layer 403.

In some examples, touch sensor structure 400 can optionally further include first bottom layer 407 disposed on the bottom surface of substrate 401. First bottom layer 407 can include the same or a different material as first top layer 403. For example, first bottom layer 407 can include an electrically conductive material, such as ITO, copper, other metals, other oxides, or the like. Touch sensor structure 400 can optionally further include second bottom layer 409 disposed on a surface of first bottom layer 407 opposite substrate 401. Second bottom layer 409 can include the same or a different material as second top layer 405. For example, second bottom layer 409 can include silver, gold, aluminum, other metals, a passivation layer, or the like. Second bottom layer 409 can be formed from a single layer or can include a combination of layers, such as a multilayer metal or metal-organic stack. In some examples, the material of second bottom layer 409 can have an ablation fluence value that is lower than an ablation fluence value of the material of the first bottom layer 407.

Figure 5:
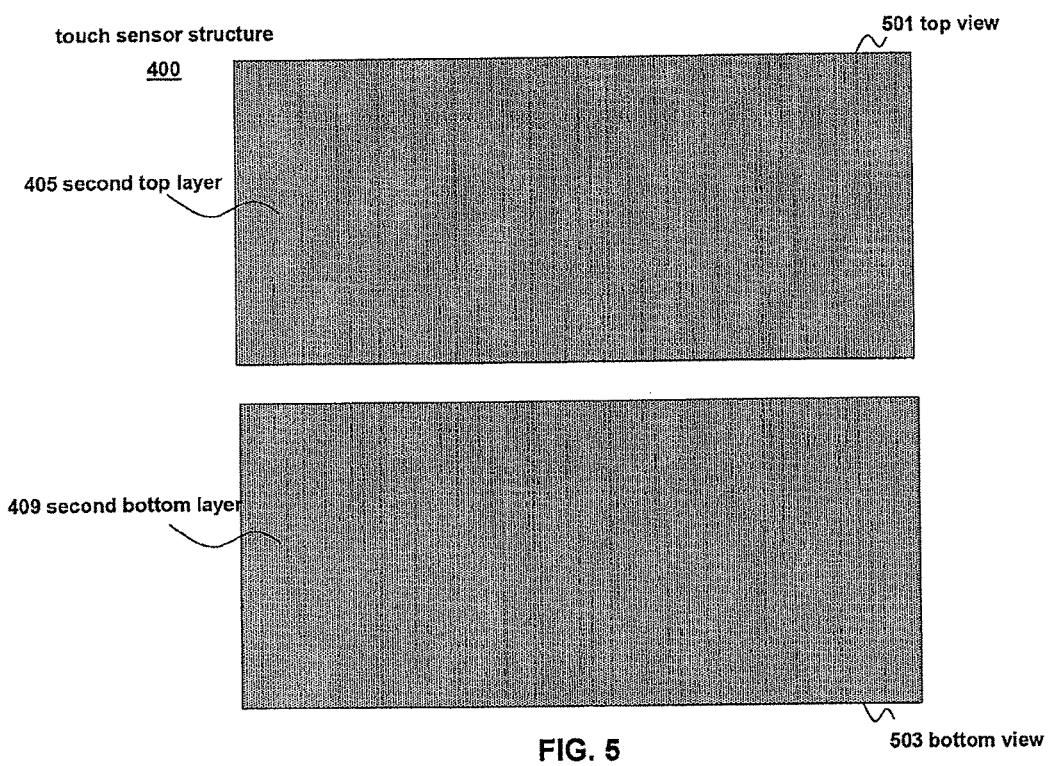
FIG. 5 illustrates top and bottom views of an exemplary touch sensor structure according to various embodiments.

FIG. 5 shows a top view 501 and a bottom view 503 of touch sensor structure 400. As can be seen, the top surface of touch sensor structure 400 can be covered by second top layer 405 and the bottom surface of touch sensor structure 400 can be covered by second bottom layer 409.

Figure 6:
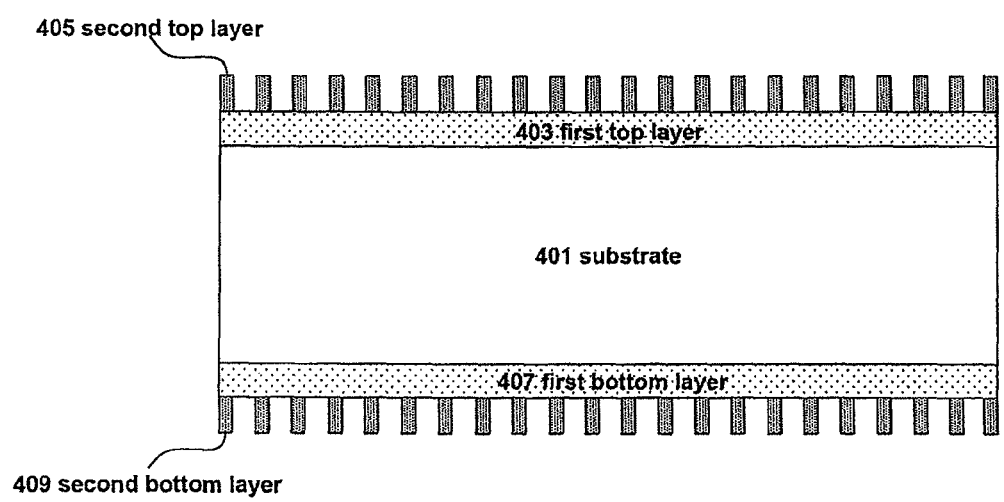
FIG. 6 illustrates a cross-sectional view of an exemplary touch sensor structure according to various embodiments.

Referring back to FIG. 3, at block 303, a second layer of the touch sensor structure can be patterned using laser ablation. In some examples, a laser, such as an Excimer Laser including but not limited to XeCl, can be applied to a surface of the touch sensor structure to generate a desired pattern. For example, as shown in FIG. 6, portions of second top layer 405 and second bottom layer 409 can be removed using laser ablation to form the illustrated pattern. As mentioned above, the ablation fluence value of first top layer 403 can be larger than the ablation fluence value of second top layer 405. Thus, when a laser emits a beam having a fluence value that is greater than or equal to the ablation fluence value of second top layer 405 and less than the ablation fluence value of first top layer 403 is applied to touch sensor structure 400, portions of second top layer 405 can be removed without removing first top layer 403. For example, first top layer 403 can be formed from ITO having an ablation fluence value that is greater than approximately 2 J/cm$^2$ and second top layer 405 can be formed from a metal, such as silver or gold, having an ablation fluence value of approximately 60-100 mJ/cm$^2$. Thus, a laser emitting a beam having a fluence value between 60-100 mJ/cm$^2$ and 2 J/cm$^2$ can be applied to touch sensor structure 400 to selectively remove portions of second top layer 405. In another example, first top layer 403 can be formed from ITO and second top layer 405 can be formed from Ti. In this example, a laser emitting a beam having a fluence value between 20 mJ/cm$^2$ and 2 J/cm$^2$ (e.g., between 20-300 mJ/cm$^2$) can be applied to touch sensor structure 400 to selectively remove portions of second top layer 405. Similarly, second bottom layer 409 can be selectively removed using a laser beam having a fluence value that is greater than or equal to the ablation fluence value of second bottom layer 409 and less than the ablation fluence value of first bottom layer 407.

Figure 7:
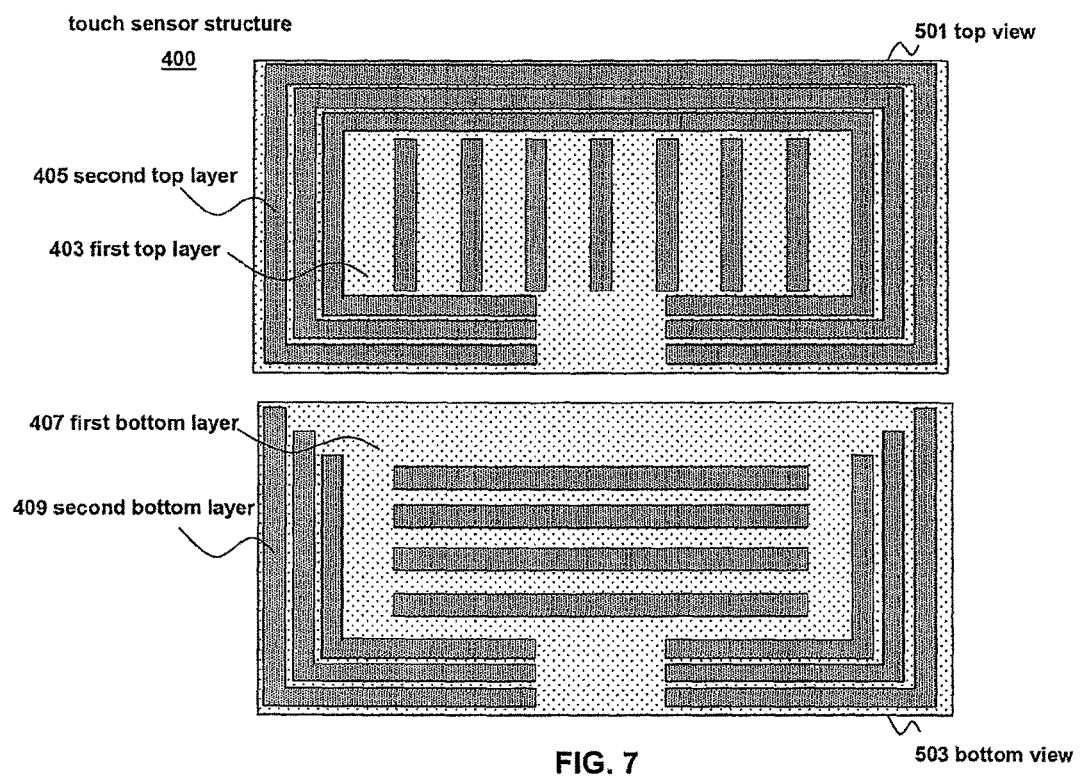
FIG. 7 illustrates top and bottom views of an exemplary touch sensor structure according to various embodiments.

FIG. 7 shows top view 501 and bottom view 503 of touch sensor structure 400 after patterning touch sensor structure 400 using laser ablation at block 303. Specifically, top view 501 shows that portions of second top layer 405 have been removed, thereby exposing first top layer 403. The portions of second top layer 405 left intact can form columns at the center of the device and can also form strips around the edge of touch sensor structure 400. As will be discussed in greater detail below, the portions of second top layer 405 left intact can be used as a mask and can correspond to the locations of the conductive traces used to form sense columns 103 (or alternatively drive rows 101) and traces used to route the sense columns 103 (or alternatively drive rows 101) along the edge of touch sensor structure 400. Similarly, bottom view 503 shows the portions of second bottom layer 409 that have been removed, thereby exposing first bottom layer 407. The portions of second bottom layer 409 left intact can form rows at the center of the device and can also form strips around the edge of touch sensor structure 400. In some examples, the rows can be perpendicular (or at least substantially perpendicular due to manufacturing tolerances) to the columns formed in second top layer 405. Additionally, as will be discussed in greater detail below, the portions of second bottom layer 409 left intact can be used as a mask and can correspond to the locations of the conductive traces used to form drive rows 101 (or alternatively sense columns 103) and traces used to route the drive rows 101 (or alternatively sense columns 103) along the edge of touch sensor structure 400. While the columns of second top layer 405 and rows of second bottom layer 409 are shown as being separate from the strips of second top layer 405 and strips of second bottom layer 409 around touch sensor structure 400, respectively, it should be appreciated that each row and each column can be coupled to a strip to be routed along the edge of touch sensor structure 400.

Figure 8:
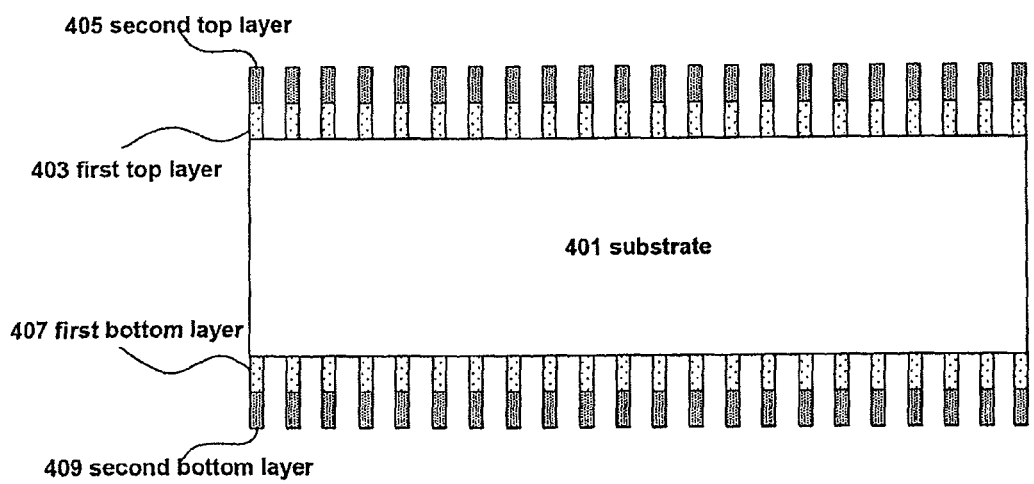
FIG. 8 illustrates a cross-sectional view of an exemplary touch sensor structure according to various embodiments.

Referring back to FIG. 3, at block 305, at least a portion of a first layer of the touch sensor structure exposed after the patterning performed at block 303 can be etched. In some examples, an etchant, such as HCl:HNO$_3$:H$_2$O or HF:H$_2$O$_2$:H$_2$O, can be used to etch the layer exposed after block 303 using the patterned layer as a mask. For example, as shown in FIG. 8, portions of first top layer 403 can be etched using second top layer 405 as a mask. The etchant used can be one that can etch the material of first top layer 403 but does not etch the material of second top layer 405 or substrate 401. One of ordinary skill in the art can select an appropriate etchant based on the materials used for first top layer 403, second top layer 405, and substrate 401. Similarly, portions of first bottom layer 407 can be etched using second bottom layer 409 as a mask. The etchant used can be one that can etch the material of first bottom layer 407 but does not etch the material of second bottom layer 409 or substrate 401.

One of ordinary skill in the art can select an appropriate etchant based on the materials used for first bottom layer 407, second bottom layer 409, and substrate 401.

Figure 9:
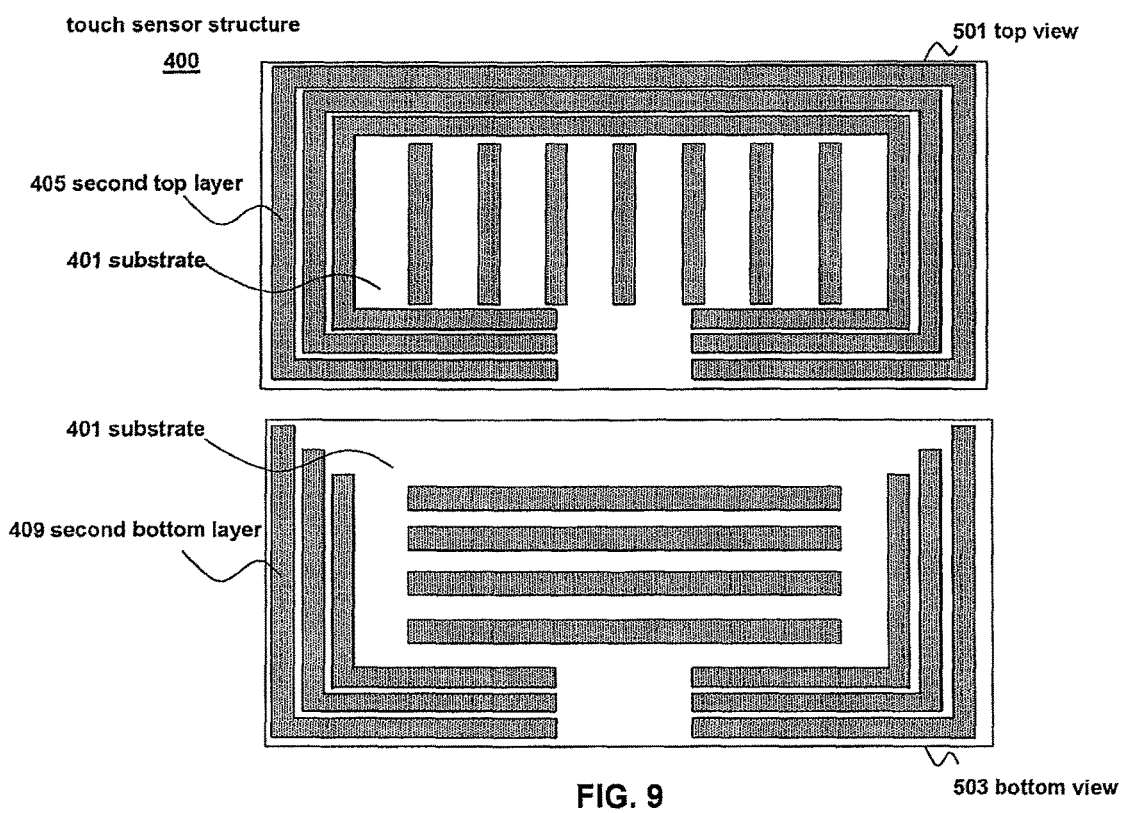
FIG. 9 illustrates top and bottom views of an exemplary touch sensor structure according to various embodiments.

FIG. 9 shows top view 501 and bottom view 503 of touch sensor structure 400 after etching first top layer 403 and first bottom layer 407. Specifically, top view 501 shows portions of the underlying substrate 401 after the exposed portions of first top layer 403 have been removed. Similarly, bottom view 503 shows portions of the underlying substrate 401 after the exposed portions of first bottom layer 407 have been removed.

Figure 10:
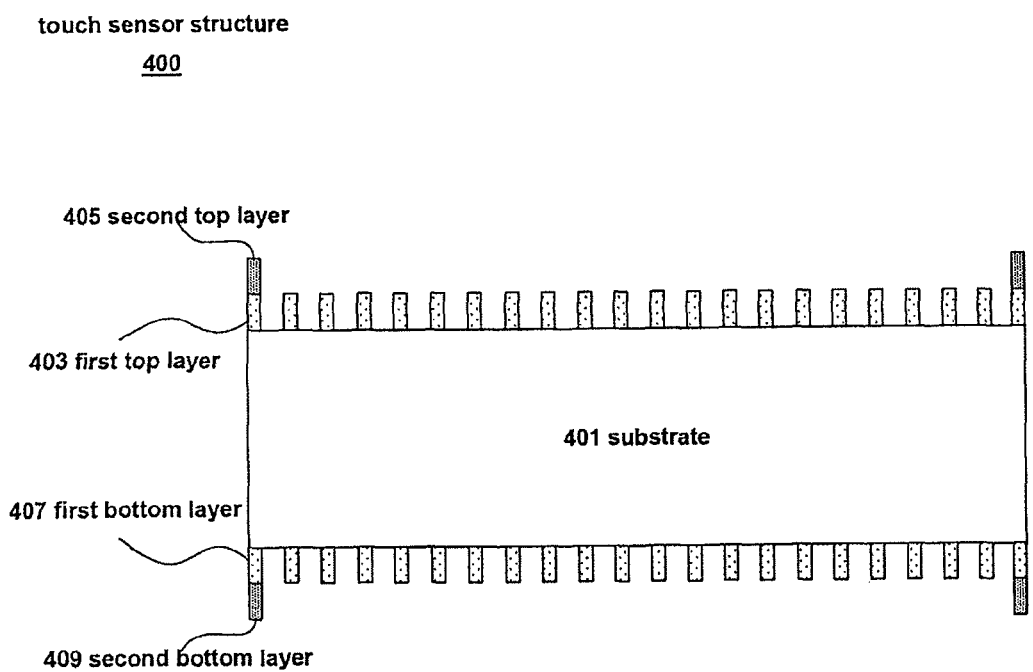
FIG. 10 illustrates a cross-sectional view of an exemplary touch sensor structure according to various embodiments.

Referring back to FIG. 3, at block 307, at least a portion of the second layer can be removed. As shown in FIG. 10, a portion of second top layer 405 can be removed using an ablation technique similar or identical to that used at block 303. Alternatively, all of second top layer 405 can be removed using an ablation technique similar or identical to that used at block 303. The laser beam used to remove some or all of second top layer 405 can have the same characteristics as that used at block 303. Alternatively, the laser beam used to remove some or all of second top layer 405 can have a different fluence value that is greater than or equal to the ablation fluence value of the material of second top layer 405 and less than the ablation fluence value of the material of first top layer 403. In other examples, some or all of second top layer 405 can be removed using an etching technique similar or identical to that used at block 305. For example, portions of second top layer 405 can be removed using an etchant configured to etch second top layer 405 but not first top layer 403 and substrate 401. The specific etchant used depends on the materials used for first top layer 403, second top layer 405, and substrate 401. For example, if first top layer 403 includes ITO, second top layer 405 includes Ti, and substrate 401 includes a glass or plastic film, then an $HCl:HNO_3:H_2O$ etchant can be used.

In some examples, the portion of second top layer 405 removed at block 307 can correspond to a viewable area of a device in which touch sensor substrate 400 is used. This can be done because in some examples, first top layer 403 can be made from an optically transparent material, such as ITO, while second top layer 405 can be made from an optically opaque material, such as silver or Ti. Thus, to avoid creating visible lines in the viewable area of a touch sensitive device, the opaque second top layer 405 can be removed in these locations. The portions of second top layer 405 outside of the viewable area can either be removed or left intact since these portions can be covered using a black mask on a cover material of the touch sensitive device. Similar or identical processes can be performed on first bottom layer 407 and second bottom layer 409.

Figure 11:
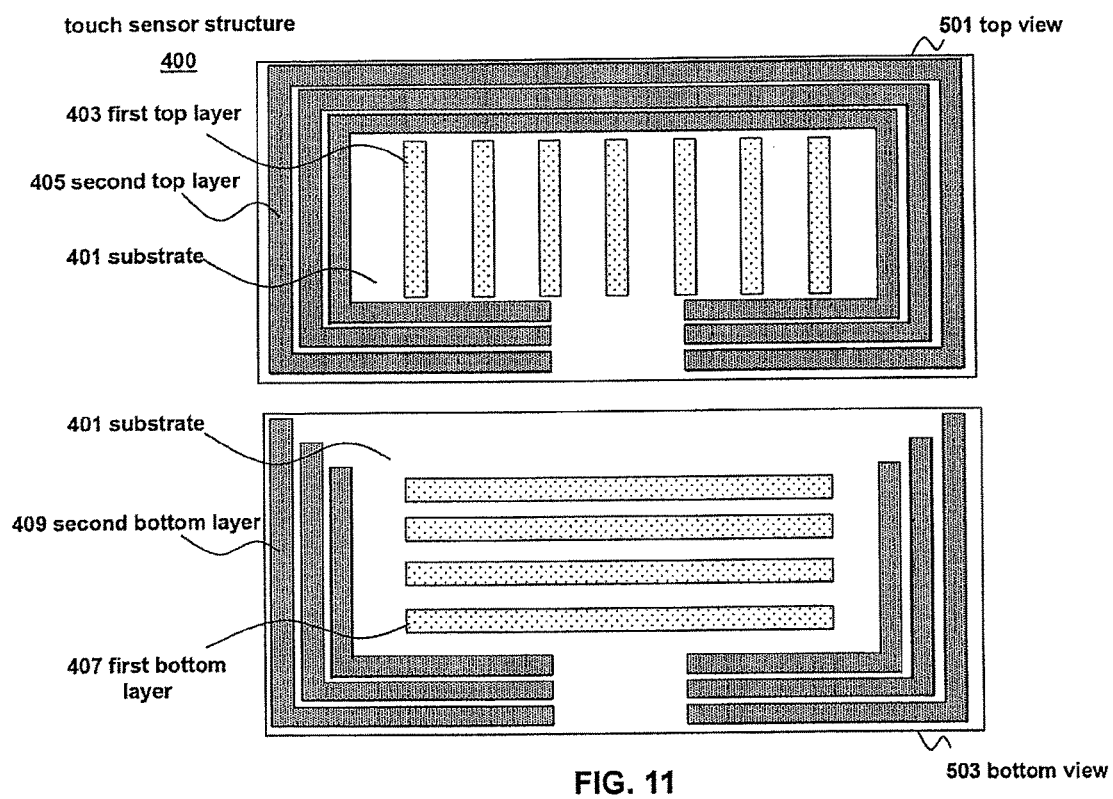
FIG. 11 illustrates top and bottom views of an exemplary touch sensor structure according to various embodiments.

FIG. 11 shows top view 501 and bottom view 503 of touch sensor structure 400 after removing portions of second top layer 405 and second bottom layer 409. Specifically, top view 501 shows that portions of second top layer 405 located towards the center of touch sensor structure 400 (corresponding to the viewable area of a device in which touch sensor structure 400 can be used) have been removed, thereby exposing the underlying first top layer 403. The portions of second top layer 405 near the edges of the device (corresponding to areas outside of the viewable area of a device in which touch sensor structure 400 can be used), however, remain intact. Similarly, bottom view 503 shows that portions of second bottom layer 409 located towards the center of touch sensor structure 400 (corresponding to the viewable area of a device in which touch sensor structure 400 can be used) have been removed, thereby exposing the underlying first bottom layer 407. Additionally, bottom view 503 shows that the portions of second bottom layer 409 near the edges of the device (corresponding to areas outside of the viewable area of a device in which touch sensor structure 400 can be used) remain intact.

By manufacturing a touch sensor using process 300, compact touch sensors can be made. This is possible due to the combination of laser ablation, which can be used to finely pattern a material, and etching, which does not result in damage to the underlying substrate. Specifically, a finely patterned etching mask can be generated by ablating a mask layer (e.g., second top layer 405 and/or second bottom layer 409) and using that mask to etch the underlying conductive material (e.g., first top layer 403 and/or first bottom layer 407). In this way, drive and/or sense lines outside of the viewable area of a device (e.g., near the right and left edges of device 200 shown in FIG. 2) can be placed closely together, thereby reducing the size of the device.

Figure 12:
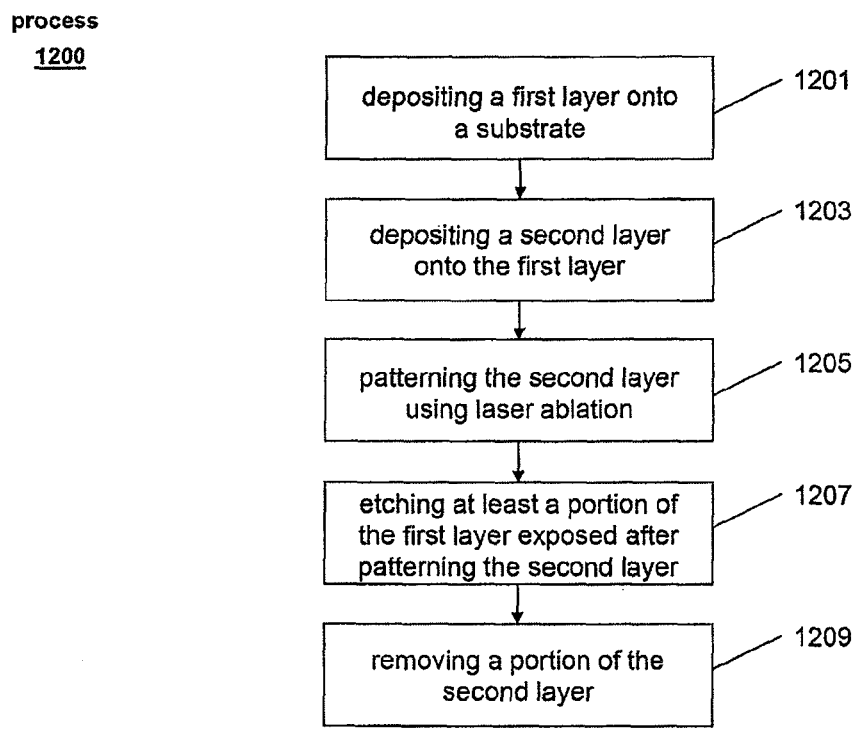
FIG. 12 illustrates an exemplary process for manufacturing a touch sensor according to various embodiments.

FIG. 12 illustrates an exemplary process 1200 for manufacturing a touch sensor similar or identical to touch sensor 100. Process 1200 is similar to process 300, except that blocks 1201 and 1203 can be used in place of block 301. Specifically, at block 1201, a first layer can be deposited onto a substrate. For example, a first layer similar or identical to first top layer 403 can be deposited onto, a substrate similar or identical to substrate 401 using any known deposition technique. The first layer can include an electrically conductive material, such as ITO, copper, silver, other metals, or other oxides.

In some examples, an additional first layer can optionally be deposited on the opposite side of the substrate. For example, a first layer similar or identical to first bottom layer 407 can be deposited onto the bottom surface of a substrate similar or identical to substrate 401. The additional first layer can include the same or a different material as first top layer 403. For example, the additional first layer can include an electrically conductive material, such as ITO, copper, other metals, or other oxides.

At block 1203, a second layer can be deposited onto the first layer. For example, a second layer similar or identical to second top layer 405 can be deposited onto the first layer (e.g., first top layer 403). The second layer can include silver, gold, aluminum, other metals, a passivation layer, or the like. The second top layer can be formed from a single layer or can include a combination of layers, such as a multilayer metal or metal-organic stack. In some examples, the material of second layer can have an ablation fluence value that is lower than an ablation fluence value of the material of the first layer. The selection of materials having these relative ablation fluence values for the first layer and the second layer can allow ablation of the second layer to be used as an etching mask for the first layer.

In some examples, an additional second layer can optionally be deposited on the additional first layer deposited onto the opposite side of the substrate. For example, a second layer similar or identical to second bottom layer 409 can be deposited onto the additional first layer that is similar or identical to first bottom layer 407. The additional second layer can include the same or a different material as second top layer 405. For example, the additional second layer can include silver, gold, aluminum, other metals, a passivation layer, or the like. The second top layer can be formed from a single layer or can include a combination of layers, such as a multilayer metal or metal-organic stack. In some examples, the material of the second layer (e.g., second bottom layer 409) can have an ablation fluence value that is lower than an ablation fluence value of the material of the first layer (e.g., first bottom layer 407).

Figure 13:
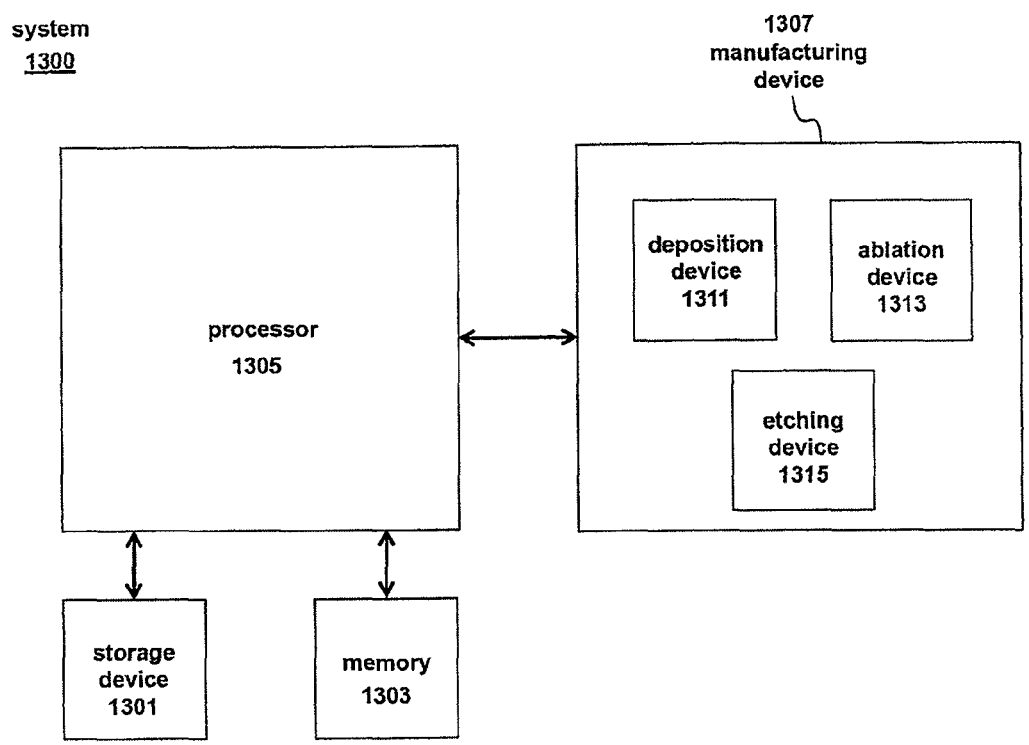
FIG. 13 illustrates an exemplary system for manufacturing a touch sensor according to various embodiments.

One or more of the functions relating to the manufacturing of a touch sensor described above can be performed by a system similar or identical to system 1300 shown in FIG. 13. System 1300 can include instructions stored in a non-transitory computer readable storage medium, such as memory 1303 or storage device 1301, and executed by processor 1305. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

System 1300 can further include manufacturing device 1307 coupled to processor 1305. Manufacturing device 1307 can include deposition device 1311 configured to deposit the various layers (e.g., first top layer 403, second top layer 405, first bottom layer 407, and second bottom layer 409) of the touch sensor structure onto the substrate, ablation device 1313 configured to ablate one or more of the layers (e.g., second top layer 405 and/or second bottom layer 409), and etching device 1315 configured to wet or dry etch one or more of the layers (e.g., first top layer 403, second top layer 405, first bottom layer 407, and second bottom layer 409). Processor 1305 can control manufacturing device 1307 and its components to deposit, ablate, etch, or combinations thereof, the various layers (e.g., first top layer 403, second top layer 405, first bottom layer 407, and second bottom layer 409) in a manner similar or identical to that described above with respect to processes 300 and/or 1200.

It is to be understood that the system is not limited to the components and configuration of FIG. 13, but can include other or additional components in multiple configurations according to various embodiments. Additionally, the components of system 1300 can be included within a single device, or can be distributed between multiple devices. In some embodiments, processor 1305 can be located within manufacturing device 1307.

Figure 14:
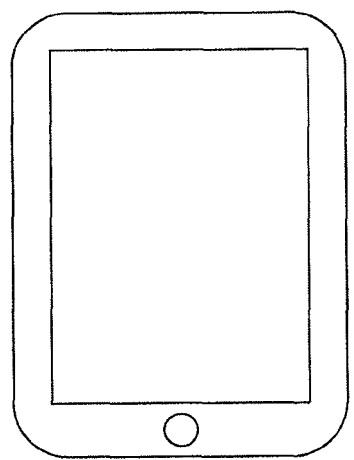
FIG. 14 illustrates an exemplary personal device that includes a touch sensor according to various embodiments.

FIG. 14 illustrates an exemplary personal device 1400, such as a tablet, that can include a touch sensor according to various embodiments.

Figure 15:
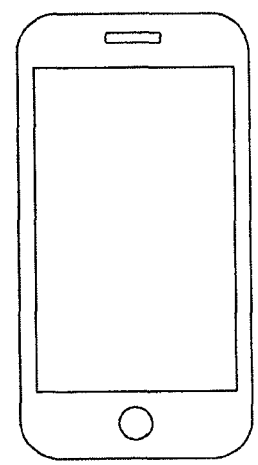
FIG. 15 illustrates another exemplary personal device that includes a touch sensor according to various embodiments.

FIG. 15 illustrates another exemplary personal device 1500, such as a mobile phone, that can include a touch sensor according to various embodiments.

Accordingly, in view of the above, some examples of the disclosure are directed to method comprising: providing a touch sensor structure comprising: a substrate; a first layer disposed on a surface of the substrate, the first layer having an associated first ablation fluence value; and a second layer disposed on a surface of the first layer opposite the substrate, the second layer having an associated second ablation fluence value that is less than the first ablation fluence value; ablating the second layer using a laser emitting energy having a fluence value that is greater than or equal to the second ablation fluence value and less than the first ablation fluence value; removing at least a portion of the first layer exposed after ablating the second layer; and removing at least a portion of the second layer after removing the portion of the first layer. Additionally or alternatively to one or more of the examples disclosed above, in some examples, removing the portion of the first layer exposed after ablating the second layer can include etching the portion of the first layer. Additionally or alternatively to one or more of the examples disclosed above, in some examples, removing the portion of the second layer after removing the portion of the first layer can include ablating the portion of the second layer. Additionally or alternatively to one or more of the examples disclosed above, in some examples, removing the portion of the second layer after removing the portion of the first layer can include etching the portion of the second layer. Additionally or alternatively to one or more of the examples disclosed above, in some examples, the substrate below the portion of the first layer can be exposed after removing the portion of the first layer.

Some examples of the disclosure are directed to a method comprising: depositing a first layer onto a substrate, the first layer having an associated first ablation fluence value; depositing a second layer on the first layer, the second layer having an associated second ablation fluence value that is less than the first ablation fluence value; patterning the second layer using a laser emitting energy having a fluence value greater than or equal to the second ablation fluence value and less than the first ablation fluence value; removing at least a portion of the first layer exposed after patterning the second layer; and removing at least a portion of the second layer after removing the portion of the first layer. Additionally or alternatively to one or more of the examples disclosed above, in some examples, removing the portion of the second layer can include etching the portion of the second layer using an etchant configured to etch the second layer without etching the first layer and the substrate. Additionally or alternatively to one or more of the examples disclosed above, in some examples, removing the portion of the second layer can include ablating the portion of the second layer using the laser emitting energy having the fluence value that is greater than or equal to the second ablation fluence value and less than the first ablation fluence value. Additionally or alternatively to one or more of the examples disclosed above, in some examples, the first layer can include indium tin oxide and the second layer can include Ti, and wherein the fluence value of the energy emitted by the laser used to pattern the second layer can be between 20-300 mJ/cm$^2$. Additionally or alternatively to one or more of the examples disclosed above, in some examples, patterning the second layer can include ablating the second layer to form: a plurality of rows; and a plurality of strips along edges of the substrate that are connected to the plurality of rows.

Some examples of the disclosure are directed to a method comprising: providing a touch sensor structure comprising: a substrate; a first layer disposed on a surface of the substrate, the first layer having an associated first ablation fluence value; and a second layer disposed on a surface of the first layer opposite the substrate, the second layer having an associated second ablation fluence value that is less than the first ablation fluence value; ablating the second layer using a laser emitting energy having a fluence value that is greater than or equal to the second ablation fluence value and less than the first ablation fluence value; and removing at least a portion of the first layer exposed after ablating the second layer. Additionally or alternatively to one or more of the examples disclosed above, in some examples, the method can further include removing at least a portion of the second layer after removing the portion of the first layer. Additionally or alternatively to one or more of the examples disclosed above, in some examples, the substrate can further include: a third layer disposed on a surface of the substrate opposite the first layer, the third layer having an associated third ablation fluence value; and a fourth layer disposed on a surface of the third layer opposite the substrate, the further layer having an associated fourth ablation fluence value that is less than the third ablation fluence value. Additionally or alternatively to one or more of the examples disclosed above, in some examples, the method can further include: ablating the fourth layer using a laser emitting energy having a fluence value that is greater than or equal to the fourth ablation fluence value and less than the third ablation fluence value; and removing at least a portion of the third layer exposed after ablating the fourth layer. Additionally or alternatively to one or more of the examples disclosed above, in some examples, the method can further include removing at least a portion of the fourth layer after removing the portion of the third layer.

Some examples of the disclosure are directed to a method comprising: depositing a first layer onto a surface of a substrate, the first layer having an associated first ablation fluence value; depositing a second layer on a surface of the first layer opposite the substrate, the second layer having an associated second ablation fluence value that is less than the first ablation fluence value; patterning the second layer using a laser emitting energy having a fluence value greater than or equal to the second ablation fluence value and less than the first ablation fluence value; and removing at least a portion of the first layer exposed after patterning the second layer. Additionally or alternatively to one or more of the examples disclosed above, in some examples, the method can further include removing at least a portion of the second layer after removing the portion of the first layer. Additionally or alternatively to one or more of the examples disclosed above, in some examples, the method can further include depositing a third layer onto a surface of the substrate opposite the first layer, the third layer having an associated third ablation fluence value; depositing a fourth layer on a surface of the third layer opposite the substrate, the fourth layer having an associated fourth ablation fluence value that is less than the third ablation fluence value; patterning the fourth layer using a laser emitting energy having a fluence value greater than or equal to the fourth ablation fluence value and less than the third ablation fluence value; and removing at least a portion of the third layer exposed after patterning the fourth layer. Additionally or alternatively to one or more of the examples disclosed above, in some examples, the method can further include removing at least a portion of the fourth layer after removing the portion of the third layer. Additionally or alternatively to one or more of the examples disclosed above, in some examples, removing the portion of the fourth layer after removing the portion of the third layer can include ablating the portion of the fourth layer. Additionally or alternatively to one or more of the examples disclosed above, in some examples, removing the portion of the fourth layer after removing the portion of the third layer can include etching the portion of the fourth layer. Additionally or alternatively to one or more of the examples disclosed above, in some examples, patterning the second layer can include patterning the second layer to form a plurality of columns, and wherein patterning the fourth layer can include patterning the fourth layer to form a plurality of rows that are at least substantially perpendicular to the plurality of columns.

Some examples of the disclosure are directed to a touch sensitive device comprising: a plurality of conductive traces formed by ablating a first layer according to a first fluence value so as to form a pattern for the plurality of conductive traces and etching a second layer to match the pattern, the etched second layer being the conductive traces. Additionally or alternatively to one or more of the examples disclosed above, in some examples, the first fluence value can be greater than or equal to an ablation fluence value of the second layer and less than an ablation fluence value of the first layer. Additionally or alternatively to one or more of the examples disclosed above, in some examples, the second layer can include indium tin oxide and the first layer can include Ti, and wherein the first fluence value is between 20-300 $mJ/cm^2$.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:
1. A touch sensitive device comprising:
a substrate;
a first layer disposed on the substrate, the first layer including first touch sensing lines and second touch sensing lines, the first layer having a first ablation fluence value;
a first area of the first layer including:
the first touch sensing lines; and
a second area of the first layer located between outside the first area to outer edges of the substrate, the second area including:
the second touch sensing lines, and
a second layer disposed on the second touch sensing lines, the second layer comprising a plurality of conductive routing traces and having a second ablation fluence value, the plurality of conductive routing traces coupled to the second touch sensing lines,
wherein the second ablation fluence value is less than the first ablation fluence value,
wherein a spacing between adjacent conductive routing traces in the second area oriented along a direction is less than a spacing between adjacent first touch sensing lines in the first area oriented along the direction, and
wherein a size and location of an entire pattern of the second touch sensing lines in all of the second area are same as a size and location of an entire pattern of the plurality of conductive routing traces in all of the second area.

2. The touch sensitive device of claim 1, wherein the second ablation fluence value is between 60-100 mJ/cm$^2$.

3. The touch sensitive device of claim 1, wherein the first layer comprises indium tin oxide and the second layer comprises Ti.

4. The touch sensitive device of claim 2, wherein the first ablation fluence value is 2 J/cm$^2$.

5. The touch sensitive device of claim 1, wherein the substrate is undamaged.

6. The touch sensitive device of claim 1, wherein the second layer is a combination of layers.

7. The touch sensitive device of claim 1, wherein the second layer includes a metal.

8. The touch sensitive device of claim 1, wherein the second layer functions as a mask for patterning the first layer.

9. The touch sensitive device of claim 1, wherein the second layer is excluded from the first area.

10. The touch sensitive device of claim 1, wherein a pattern of the first layer is different than a pattern of the second layer in the first area.

11. The touch sensitive device of claim 1, wherein the second layer is patterned to form:
   a plurality of rows; and
   a plurality of strips along edges of the substrate that are connected to the plurality of rows.

12. The touch sensitive device of claim 1, further comprising:
   a third layer located in the first and a second areas and having a third ablation fluence value; and
   a fourth layer located in the second area and having a fourth ablation fluence value.

13. The touch sensitive device of claim 12, wherein the third and fourth layers are disposed on the substrate opposite the first layer.

14. The touch sensitive device of claim 12, wherein the fourth layer is disposed on the third layer, and the third layer is disposed on the substrate.

15. The touch sensitive device of claim 12, wherein the fourth ablation fluence value is less than the third ablation fluence value.

16. The touch sensitive device of claim 12, wherein the fourth layer comprises indium tin oxide, and the third layer comprises Ti.

17. The touch sensitive device of claim 12, wherein the fourth ablation fluence value is 2J/cm$^2$ and the third ablation fluence value is between 60-100 mJ/cm$^2$.

18. The touch sensitive device of claim 12, wherein a pattern of the third layer is same as a pattern of the fourth layer in the second area.

19. The touch sensitive device of claim 12, wherein the first layer is patterned to form a plurality of columns, and the third layer is patterned to form a plurality of rows that are at least substantially perpendicular to the plurality of columns.

20. The touch sensitive device of claim 12, wherein the fourth layer is a same material as the second layer.

21. The touch sensitive device of claim 12, wherein the fourth layer is a different material than the second layer.

22. The touch sensitive device of claim 1, wherein the first area is a viewable area, and the second area is a border area.

* * * * *